US012578409B2

(12) United States Patent
Ahn et al.

(10) Patent No.: US 12,578,409 B2
(45) Date of Patent: Mar. 17, 2026

(54) METHODS, APPARATUSES, SYSTEMS AND COMPUTER-READABLE MEDIUMS FOR ADJUSTING FREQUENCY IN MEDICAL IMAGING

(71) Applicant: Siemens Healthineers AG, Forchheim (DE)

(72) Inventors: Sinyeob Ahn, Pacheco, CA (US); Marcus Couch, Montreal (CA); Lumeng Cui, Burnaby (CA)

(73) Assignee: Siemens Healthineers AG, Forchheim (DE)

( * ) Notice: Subject to any disclaimer, the term of this patent is extended or adjusted under 35 U.S.C. 154(b) by 218 days.

(21) Appl. No.: 18/633,720

(22) Filed: Apr. 12, 2024

(65) Prior Publication Data

US 2025/0321308 A1 Oct. 16, 2025

(51) Int. Cl.
*G01R 33/56* (2006.01)
*G01R 33/567* (2006.01)

(52) U.S. Cl.
CPC ................................ *G01R 33/5676* (2013.01)

(58) Field of Classification Search
CPC .............. G01R 33/5676; G01R 33/485; G01R 33/583; G01R 33/565
See application file for complete search history.

(56) References Cited

U.S. PATENT DOCUMENTS

| | | | |
|---|---|---|---|
| 8,604,787 B2 | 12/2013 | Posse | |
| 10,045,741 B2 | 8/2018 | Tisdall et al. | |
| 2005/0248343 A1 | 11/2005 | Kruger et al. | |
| 2021/0364588 A1* | 11/2021 | Kuratani | G01R 33/56563 |

FOREIGN PATENT DOCUMENTS

| | | |
|---|---|---|
| GB | 2528123 A | 1/2016 |
| WO | 2023034044 A1 | 3/2023 |

OTHER PUBLICATIONS

Wallace, T. E., Kober, T., Stockmann, J. P., Polimeni, J. R., Warfield, S. K., & Afacan, O. (2022), "Real-time shimming with FID navigators". Magnetic Resonance in Medicine, 88(6), 2548-2563.
Wallace, T. E., Afacan, O., Waszak, M., Kober, T., & Warfield, S. K. (2018). "Head motion measurement and correction using FID navigators", Magnetic Resonance in Medicine, 81(1), 258-274.

(Continued)

*Primary Examiner* — G.M. A Hyder

(57) ABSTRACT

A system for performing a real-time frequency adjustment during medical imaging includes at least one memory and at least one processor. The at least one memory is configured to store instructions and the at least one processor is configured to execute the instructions to cause the system to apply a navigator before a repetition time ("TR") variant spatial-encoding event of a first TR of a plurality of TRs, determine phase change information from a navigator signal acquired after the navigator is applied, and adjust a radio frequency ("RF") pulse frequency of the medical imaging based on the phase change information.

25 Claims, 7 Drawing Sheets

(56) References Cited

OTHER PUBLICATIONS

Thiel, T. et al. (2002), "Phase coherent averaging in magnetic resonance spectroscopy using interleaved navigator scans: Compensation of motion artifacts and magnetic field instabilities", Magnetic Resonance in Medicine, 47(6), 1077-1082.

Tal, A., & Gonen, O. (2012), "Localization errors in MR spectroscopic imaging due to the drift of the main magnetic field and their correction", Magnetic Resonance in Medicine, 70(4), 895-904.

Near, J. et al. (2014), "Frequency and phase drift correction of magnetic resonance spectroscopy data by spectral registration in the time domain", Magnetic Resonance in Medicine, 73(1), 44-50.

Lee, C., Choi, I., & Lee, P. (2018), "Prospective frequency correction using outer volume suppression-localized navigator for MR spectroscopy and spectroscopic imaging", Magnetic Resonance in Medicine, 80(6), 2366-2373.

Hui, S. C. et al. (2021), "Frequency drift in MR spectroscopy at 3T", NeuroImage, 241, 118430.

T. Hess, A. et al. (2011), "Real-Time Motion and BO Corrected Single Voxel Spectroscopy Using Volumetric Navigators", Magnetic Resonance in Medicine, 66, 314-323.

Edden, R. A. et al. (2016), "Prospective frequency correction for macromolecule-suppressed GABA editing at 3T", Journal of Magnetic Resonance Imaging, 44(6), 1474-1482.

* cited by examiner

602

604

606

608

606

608

METHODS, APPARATUSES, SYSTEMS AND COMPUTER-READABLE MEDIUMS FOR ADJUSTING FREQUENCY IN MEDICAL IMAGING

TECHNICAL FIELD

Example embodiments relate to adjusting frequency in medical imaging during acquisition of images. In particular, one or more example embodiments relate to magnetic resonance ("MR") imaging and frequency adjustment during acquisition of MR images.

BACKGROUND

During medical imaging radio frequency ("RF") pulse frequency may drift and may need to be adjusted.

SUMMARY

In at least one example embodiment, a system for performing a real-time frequency adjustment during medical imaging is described. The system may include at least one memory and at least one processor. The at least one memory may be configured to store instructions and the at least one processor may be configured to execute the instructions to cause the system to apply a navigator before a repetition time ("TR") variant spatial-encoding event of a first TR of a plurality of TRs, determine phase change information from a navigator signal acquired after the navigator is applied, and adjust a radio frequency ("RF") pulse frequency of the medical imaging based on the phase change information.

In at least one example embodiment, each TR of the plurality of TRs may include at least one TR invariant event and a TR variant event. In at least one example embodiment, the at least one TR invariant event may include at least one TR invariant RF pulse. In at least one example embodiment, the at least one TR invariant event may further include at least one TR invariant gradient pulse.

In at least one example embodiment, the TR variant spatial-encoding event may include at least one TR variant gradient pulse.

In at least one example embodiment, the adjusting the RF pulse frequency of the medical imaging may be a real time frequency adjustment that is localized to an imaging region of interest.

In at least one example embodiment, the acquiring, the determining, and the adjusting may be repeated during each TR of the plurality of TRs. In at least one example embodiment, the at least one processor may be configured to execute the instructions to further cause the system to compensate for signal to noise ratio during the medical imaging by using a moving average of the navigator signal calculated from each TR of the plurality of TRs of the medical imaging.

In at least one example embodiment, the at least one processor may be configured to execute the instructions to further cause the system to acquire a reference frequency from an initial number of TRs of the plurality of TRs. In at least one example embodiment, the at least one processor may be configured to execute the instructions to further cause the system to determine a scan frequency based on the phase change information and a dwell time and determine a change in frequency based on the reference frequency and the scan frequency. In at least one example embodiment, the RF pulse frequency may not be adjusted when the change in frequency exceeds a threshold value.

At least one other example embodiment provides a method for performing a real-time frequency adjustment during medical imaging. The method may include applying a navigator before a TR variant spatial-encoding event of a first TR of a plurality of TRs, determining phase change information from a navigator signal acquired after the navigator is applied, and adjusting a RF pulse frequency of the medical imaging based on the phase change information.

In at least one example embodiment, each TR of the plurality of TRs may include at least one TR invariant event and a TR variant event. In at least one example embodiment, the at least one TR invariant event may include at least one TR invariant RF pulse. In at least one example embodiment, the at least one TR invariant event may further include at least one TR invariant gradient pulse.

In at least one example embodiment, the TR variant spatial-encoding event may include at least one TR variant gradient pulse.

In at least one example embodiment, the adjusting the RF pulse frequency of the medical imaging may be a real time frequency adjustment that is localized to an imaging region of interest.

In at least one example embodiment, the acquiring, the determining, and the adjusting may be repeated during each TR of the plurality of TRs. In at least one example embodiment, the method may further include compensating for signal to noise ratio during the medical imaging by using a moving average of the navigator signal calculated from each TR of the plurality of TRs of the medical imaging.

In at least one example embodiment, the method may further include acquiring a reference frequency from an initial number of TRs of the plurality of TRs. In at least one example embodiment, the method may further include determining a scan frequency based on the phase change information and a dwell time and determining a change in frequency based on the reference frequency and the scan frequency. In at least one example embodiment, the RF pulse frequency may not be adjusted when the change in frequency exceeds a threshold value.

At least one other example embodiment provides a non-transitory computer readable medium storing computer readable instructions that, when executed by one or more processors of a system, cause the system to perform a method for performing a real-time frequency adjustment during medical imaging. The method may include applying a navigator before a TR variant spatial-encoding event of a first TR of a plurality of TRs, determining phase change information from a navigator signal acquired after the navigator is applied, and adjusting a RF pulse frequency of the medical imaging based on the phase change information.

At least one other example embodiment provides a device for performing a real-time frequency adjustment during medical imaging. The device may include means for applying a navigator before a TR variant spatial-encoding event of a first TR of a plurality of TRs, determining phase change information from a navigator signal acquired after the navigator is applied, and adjusting a RF pulse frequency of the medical imaging based on the phase change information.

BRIEF DESCRIPTION OF THE DRAWINGS

Other objects and features of the present invention will become apparent from the following detailed description considered in conjunction with the accompanying drawings. The drawings, however, are only examples and schematics solely for the purpose of illustration and do not limit the present invention. In the drawings.

DETAILED DESCRIPTION

Figure 1A:
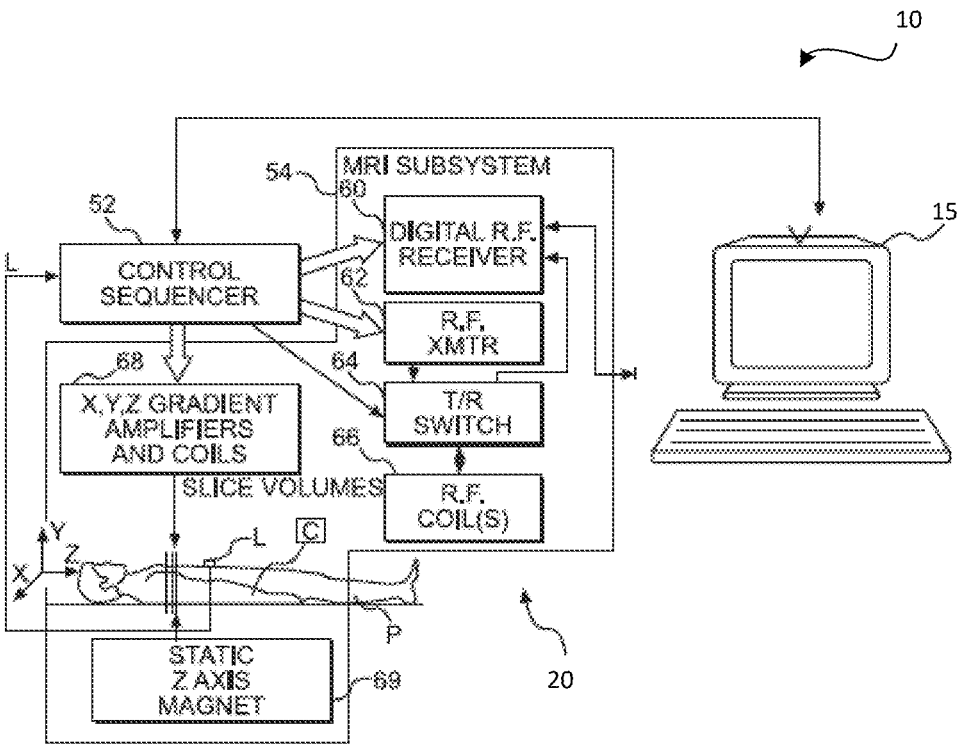
FIG. 1A is an illustration of a system for implementing methods according to example embodiments.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

Independent of the grammatical term usage, individuals with male, female or other gender identities are included within the term.

One or more example embodiments described herein relate to methods, apparatuses, systems, and/or non-transitory computer-readable mediums configured to determine, present, and/or provide an adjustment to a frequency during medical imaging. In at least one example embodiment, the systems and methods described herein relate to medical imaging and magnetic resonance (MR) imaging in particular. In some example embodiments, the frequency may be a radio frequency ("RF") pulse frequency that may be adjusted in real time during medical imaging. Thus, one or more example embodiments described herein may enable real time adjustments during medical imaging which may lead to improved image quality and improved spectral quality. The embodiments described herein are also able to be performed without performing a calibration or reference frequency scan prior to beginning a medical imaging process which enables the medical imaging to be carried out in a more streamlined manner and reduces time needed to perform medical imaging.

Figure 1B:
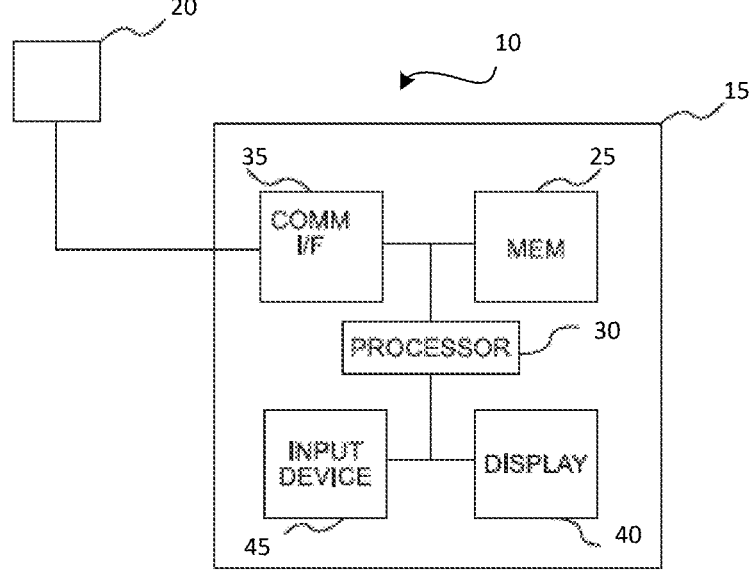
FIG. 1B is a block diagram illustrating an example embodiment of the system shown in FIG. 1A.

FIG. 1A is an illustration of a system for implementing methods according to example embodiments described herein. FIG. 1B is a block diagram illustrating an example embodiment of the system shown in FIG. 1A. Although one or more example embodiments may be described herein with regard to the systems shown in FIGS. 1A and 1B, example embodiments should not be limited to these examples.

Referring to FIGS. 1A and 1B, a system 10 may include an information processing device 15 and an acquisition device 20. The acquisition device 20 includes an MRI real-time control sequencer 52 and an MRI subsystem 54. The MRI subsystem 54 may include XYZ magnetic gradient coils and associated amplifiers 68, a static Z-axis magnet 69, a digital radiofrequency ("RF") transmitter 62, a digital RF receiver 60, a transmit/receive switch 64, and RF coil(s) 66. The acquisition device 20 may include additional or fewer components in some example embodiments, and may be configured to image a patient.

The MRI subsystem 54 may be controlled in real-time by the MRI real-time control sequencer 52 to generate and measure magnetic field and radio frequency emissions that stimulate nuclear magnetic resonance ("NMR") phenomena in an object P (e.g., a human or other living body) to be imaged.

The information processing device 15 may implement a method for processing medical data, such as medical image data. As discussed in more detail below, one or more information processing devices such as the information processing device 15 may be configured to implement any or all of the example embodiments described herein.

In FIGS. 1A and 1B, the acquisition device 20 is shown as a separate unit from the information processing device 15. It is, however, possible to integrate the information processing device 15 as part of the acquisition device 20.

The information processing device 15 may include a memory 25, processing circuitry including at least one processor such as processor 30, a communication interface 35 and/or an input device 45. The memory 25 may include various special purpose program codes including computer executable instructions which may cause the processor 30 of the information processing device 15 to perform one or more of the methods according to example embodiments described herein. The acquisition device 20 may provide the medical data to the information processing device 15 via the input device 45. In some example embodiments, the information processing device 15 may additionally include a display 40 that may be configured to output information about one or more of an imaging process, the information processing device 15, or the acquisition device 20.

Figure 2:
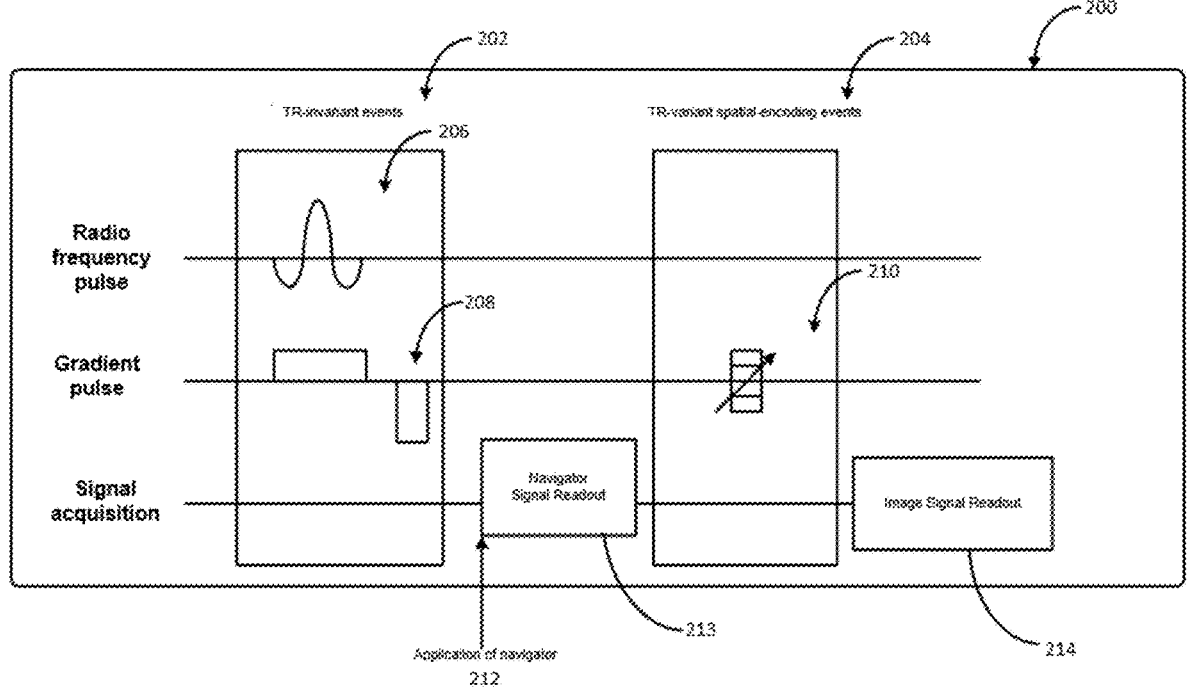
FIG. 2 is an illustration of a pulse sequence diagram for performing a real-time frequency adjustment during medical imaging according to example embodiments.

FIG. 2 is an illustration of an example embodiment of a pulse sequence diagram 200 for performing a real-time frequency adjustment during medical imaging. In at least one example embodiment, medical imaging may include one or more repetition time (TR) invariant events 202 and one or more TR variant spatial-encoding events 204. The one or more TR invariant events 202 may be events that occur every TR of a MR imaging procedure. The one or more TR variant spatial-encoding events 204 may vary over different TRs of an MR imaging procedure. In at least one example embodiment, there may be no TR variant spatial-encoding events 204 in one or more TRs. In at least one example embodiment, the one or more TR invariant events 202 may include at least one TR invariant RF pulse 206.

Further, one or more TR invariant events 202 may further include at least one TR invariant gradient pulse 208. In at least one example embodiment, the one or more TR variant spatial-encoding events 204 may include at least one TR variant gradient pulse 210.

In at least one example embodiment, a navigator 212 may be applied before the one or more TR variant spatial-encoding events 204. In embodiments where there is no TR variant spatial-encoding event, the navigator 212 may be applied after at least one TR invariant event. In particular, the navigator 212 may be applied after at least one selective RF pulse. The application of the navigator 212 occurs upon opening of an analog to digital converter ("ADC") window to initiate a navigator signal readout 213. The navigator signal readout 213 may be an ADC readout of a signal induced by an RF pulse in a preceding TR invariant event to track dynamic information of a region of interest of a patient for an MR imaging procedure. In particular, the navigator signal readout 213 may read a signal induced by the at least one TR invariant RF pulse 206. The navigator signal readout 213 is used to track dynamically changing information of an anatomical region. In at least one example embodiment, the occurrence of the navigator 212 and the navigator signal readout 213 may be one event such that the navigator signal readout 213 occurs upon application of the navigator 212. The navigator signal readout 213 is an acquisition of a signal and may be referred to herein as a navigator signal.

The navigator signal readout 213 may be a complex signal containing a real and an imaginary component and thus may indicate both an amplitude and a phase of the navigator signal. The navigator signal readout 213 may be used to determine phase change information that may be used to adjust a radio frequency (RF) pulse frequency of the medical imaging. The RF pulse frequency may be adjusted each TR during the medical imaging.

An image signal readout 214 may occur after the navigator 212 is applied. The image signal readout 214 may similarly be an ADC readout of a signal induced by an RF pulse in a preceding TR invariant event which may occur after the ADC readout that is the navigator signal readout 213. The image signal readout 214 may be the acquired data that is used to form a final spectra or image in the medical imaging procedure. In at least one example embodiment, the signal 214 may be acquired after the navigator 212 is applied, after the navigator signal readout 213, and after the one or more TR variant spatial encoding events 204.

In example embodiments where there is no TR variant spatial encoding event, the image signal readout 214 may occur after the navigator 212 and the navigator signal readout 213. In at least one example embodiment, there may be a time gap between the navigator signal readout 213 and the image signal readout 214 or the navigator signal readout 213 and the image signal readout 214 may occur back-to-back such that there is no time gap between the events. In at least one example embodiment, the image signal readout 214 may at least partially overlap with the navigator signal readout 213. For example, the image signal readout 214 may occur prior to the navigator signal readout 213 being completed. In at least one example embodiment, when there is no TR variant spatial event, the navigator signal readout 213 and the image signal readout 214 may be acquired as one signal readout from an ADC.

In at least one example embodiment, the events shown in the pulse sequence diagram 200 may be repeated for each TR of the medical imaging. Thus, the RF pulse frequency may be continuously updated in real-time during the medical imaging.

Figure 3:
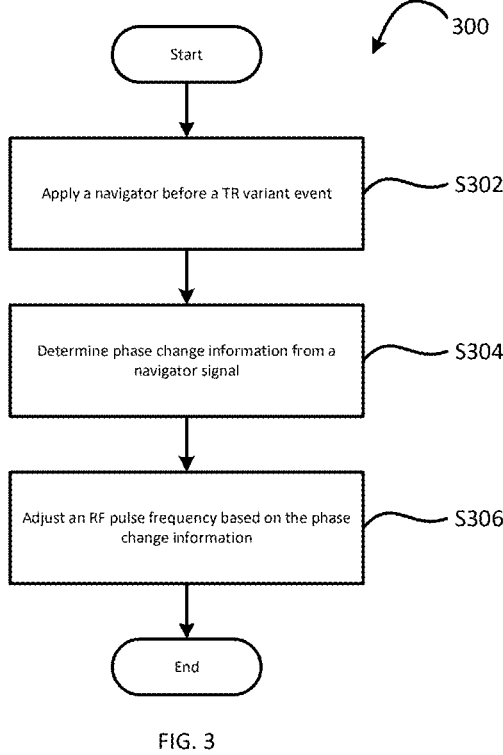
FIG. 3 is a flow chart of a method for performing a real-time frequency adjustment during medical imaging according to example embodiments.

FIG. 3 is a flow chart of a method 300 of performing a real-time frequency adjustment during medical imaging according to an example embodiment. The method 300 will be described with reference to the pulse sequence diagram 200 of FIG. 2 and the system 10 of FIGS. 1A and 1B.

Referring to FIG. 3, the method 300 may begin at step S302 when the processor 30 applies the navigator 212 before the one or more TR variant spatial-encoding events 204. In at least one example embodiment the navigator 212 may be applied after the one or more TR invariant events 202. Additionally or alternatively, the navigator 212 may be applied during the one or more TR invariant events 202 so long as the navigator 212 is applied before the one or more TR variant spatial-encoding events 204. As described above, application of the navigator 212 occurs upon opening of an analog to digital converter ("ADC") window to initiate a navigator signal readout 213. After the navigator 212 is applied, the processor 30 determines phase change information from the navigator signal readout 213 at step S304. Additional details of determining the phase change information are described below in FIG. 4. The phase change information may be determined by collecting phase information from all coil elements without considering spatial information of coil sensitivity.

At step S306, the processor 30 adjusts the RF pulse frequency based on the phase change information. The RF pulse frequency may be referred to herein as the frequency. The frequency is adjusted in real time during the method 300. The frequency adjustment is localized to an imaging region of interest during the medical imaging. In particular, the one or more TR invariant events 202 may typically perform slice selection. Thus, application of the navigator 212 after the one or more TR invariant events 202 may localize the frequency adjustment to the imaging region that corresponds to the slice selection of the one or more TR invariant events 202. By adjusting the frequency using the phase change information that is independent of spatial information of coil sensitivity, a number of receiver coil elements and/or the receiver coil sensitivities or spatial dependency characteristics of coil elements may not be restricted. Thus, the frequency adjustment described herein has no coil dependency. This may allow the embodiments described herein to be performed on a single channel coil and may be performed without a calibration scan.

The method 300 may be repeated for each TR of medical imaging. Thus, step S302, step S304, and step S306 are repeated each TR. In particular, the RF pulse frequency may be adjusted each TR during the medical imaging. Thus, the RF pulse frequency may be continuously adjusted based on phase change information of each TR of the medical imaging.

The method of FIG. 3 is performed during an MR imaging acquisition. In particular, as an MR imaging acquisition is occurring, the real-time frequency adjustment as described in FIG. 3 is performed to continuously update the RF pulse frequency of the medical imaging.

Figure 4:
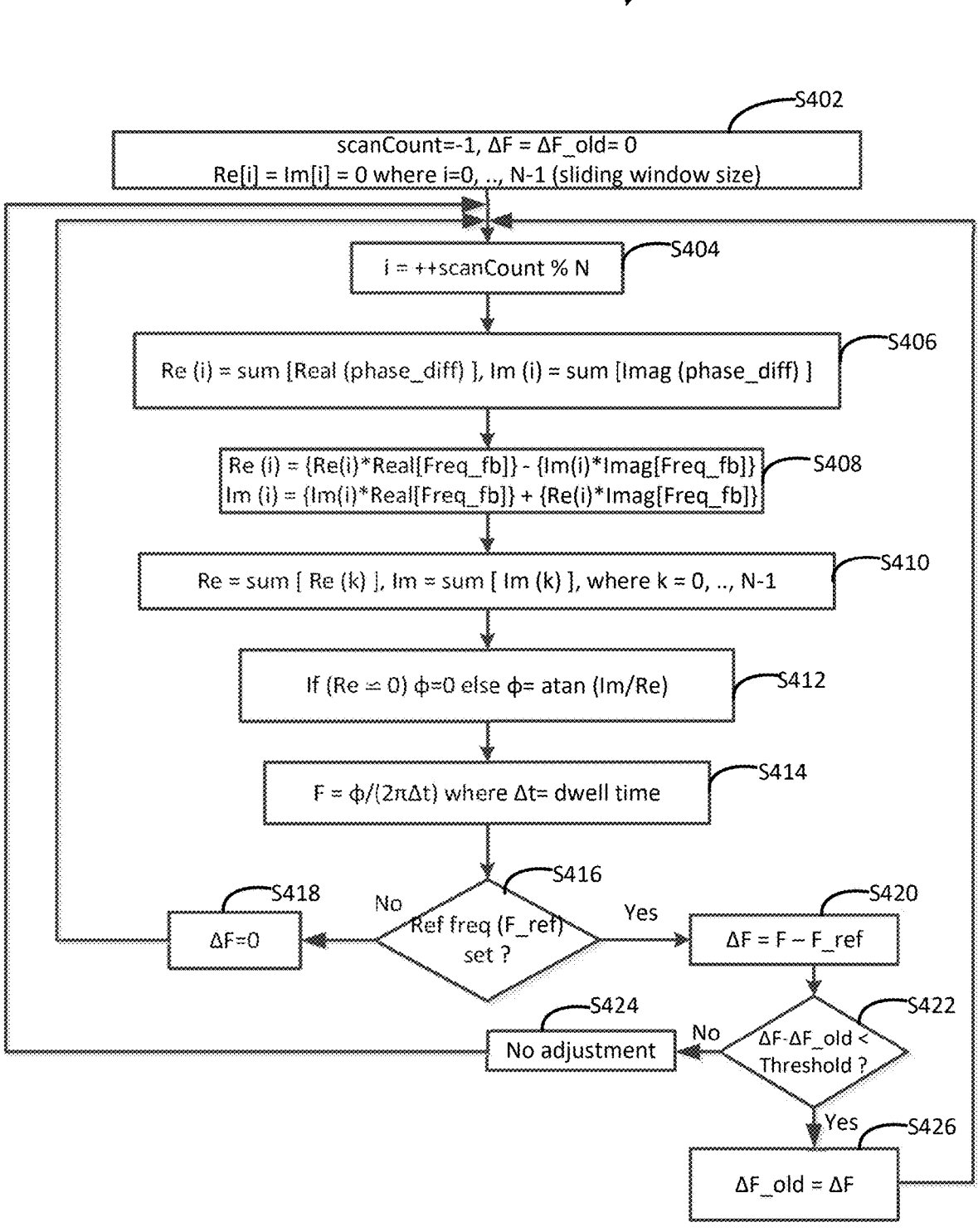
FIG. 4 is a flow chart of the steps of determining phase change information and of adjusting an RF pulse frequency of the method of FIG. 3 according to example embodiments.

FIG. 4 is a flow chart of an example embodiment of a method 400 that includes step S304 and step S306 of the method 300 of FIG. 3. Step S304 includes steps S402, S404, S406, S408, S410, and S412 of FIG. 4 and step S306 includes steps S414, S416, S418, S420, S422, S424, and S426. All of the steps of the method 400, except for step S402 which is an initialization process and is performed only once, are repeated for each TR of a plurality of TRs as described above with reference to FIG. 3.

At step S402, parameters for performing a frequency adjustment are initially set by the processor 30. In particular, a scan count variable is set to −1, a change in frequency and an old change in frequency are set to zero, a sliding window size is set wherein a sliding window count variable is set to zero, and a real and imaginary portion of phase change information is set to zero. The old change in frequency may be a variable indicative of a previous frequency change and the change in frequency may be a variable indicative of a frequency change of a current iteration. The initial parameters are set prior to the start of medical imaging. In at least one example embodiment, the sliding window size may be set by an operator or a medical professional prior to the start of the medical imaging.

At step S404, the sliding window count variable is incremented by 1. The sliding window count variable, i, is determined by incrementing the scan count variable modulus N, where N is the sliding window size. Thus, the sliding window count variable, i, ranges from a value between 0 and N-1. The sliding window may be set to an integer value and may be used to keep a moving average over a number of iterations of the method 300 and the method 400, excluding step S402 which is set once and not repeated.

At step S406, the processor 30 calculates the phase change between two adjacent data points in a navigator signal using complex conjugate multiplication of the two complex data points and sums up the calculated phase changes. In particular, the real portion of the phase change information is determined by adding each real portion of the phase change information and the imaginary portion of the phase change information is determined by adding each imaginary portion of the phase change information.

At step S408, additional calculations are performed by the processor 30 for calculating an accumulative phase change for the current iteration by using complex multiplication. The real portion of the phase change information is calculated by: $Re(i) = \{Re(i)*Real \ [Freq\_fb]\} - \{Im \ (i)*Imag \ [Freq\_fb]\}$ where Freq_fb is a feedback frequency. The feedback frequency is a measured frequency of the previous iteration. The imaginary portion of the phase change information is calculated by: $Im(i) = \{Im(i)*Real \ [Freq\_fb]\} + \{Re \ (i)*Imag \ [Freq\_fb]\}$.

At step S410, a total real portion of the phase change information and a total imaginary portion of the phase change information is determined by the processor 30 over the sliding window. For example, if the sliding window is five, then the total real portion of the phase change information is a sum of the real portion of the phase change information of the last five TRs and the total imaginary portion of the phase change information is a sum of the imaginary portion of the phase change information of the last five TRs. By using a sliding window to calculate the phase change information, the embodiments described herein do not require a reference scan for a prospective frequency adjustment and enable a real time frequency adjustment to be handled during the medical imaging. By using the sliding window to calculate the phase change information, a moving average of the navigator signal readout 213 is used which may compensate for signal to noise ratio during the medical imaging. For example, signal to noise ratio may be proportional to a square root of the sliding window size. Thus, adjusting the sliding window size may impact the signal to noise ratio for the medical imaging.

At step S412, the processor 30 may determine a phase variable, q. If the total real portion of the phase change information is zero, then o is set to zero to avoid dividing by zero. If the total real portion of the phase change information is non-zero, then o is equal to the arctangent of the quotient of the total imaginary portion of the phase change information divided by the total real portion of the phase change information: $\varphi = a \tan(Im/Re)$ where Im is the total imaginary portion of the phase change information and Re is the total real portion of the phase change information.

At step S414, the processor 30 may calculate a frequency. The frequency is calculated by dividing the phase variable determined in step S412 by the product of 2 times a dwell time: $F = \varphi/2 \ \Delta t$ where $\Delta t$ is the dwell time. The dwell time may be the time between samplings of MR imaging as is known in the art.

At step S416, the processor 30 determines whether a reference frequency is set. The reference frequency may be an RF pulse frequency determined for the medical imaging. A reference frequency is determined over a number of TRs. For example, a reference frequency may be an average frequency over a number of TRs. In at least one example embodiment, the reference frequency is determined over a number of TRs. For example, in at least one example embodiment, five TRs may be used to determine a reference frequency. Thus, a reference frequency may be an average frequency over the five TRs. The reference frequency is determined at a start of medical imaging and is used to determine a change in frequency and to adjust the frequency as the medical imaging progresses as described in further detail below.

The method 400 proceeds to step S418 if a reference frequency is not set. If a reference frequency is not set, a change in frequency, $\Delta F$, is set to zero. Then, the method 400 returns to step S404 where the scan count variable is incremented for a next TR of the plurality of TRs. The process then continues as discussed herein.

Returning to step S416, the method 400 proceeds to step S420 if a reference frequency is set. At step S420, the change in frequency is calculated by the processor 30 as the difference between the frequency and the reference frequency: $\Delta F = F - F\_ref$.

At step S422, the processor 30 determines if a difference of the change in frequency minus the old frequency is greater than a threshold value. The threshold value may be set at a start of the medical imaging and may be dependent on a type of imaging. In particular, the threshold value may be empirically determined and may be a function of a system type, signal to noise ratio, the sliding window size, a field of view, or another variable of the particular medical imaging.

At step S424, no adjustment is made if the difference of the change in frequency minus the old change in frequency is greater than the threshold value. For example, there may be a situation where there is a random noise spike that may impact the measured signal. Additionally, motion may induce an abrupt change in frequency which may exceed the threshold value. These abrupt and/or random events may result in poor data and adjusting the frequency will not impact the data quality. Thus, the frequency is only adjusted in response to a change being below the threshold value. After step S424, the method 400 returns to step S404 where the scan count variable is incremented for a next TR of the plurality of TRs. The process then continues as discussed herein.

Figure 5:
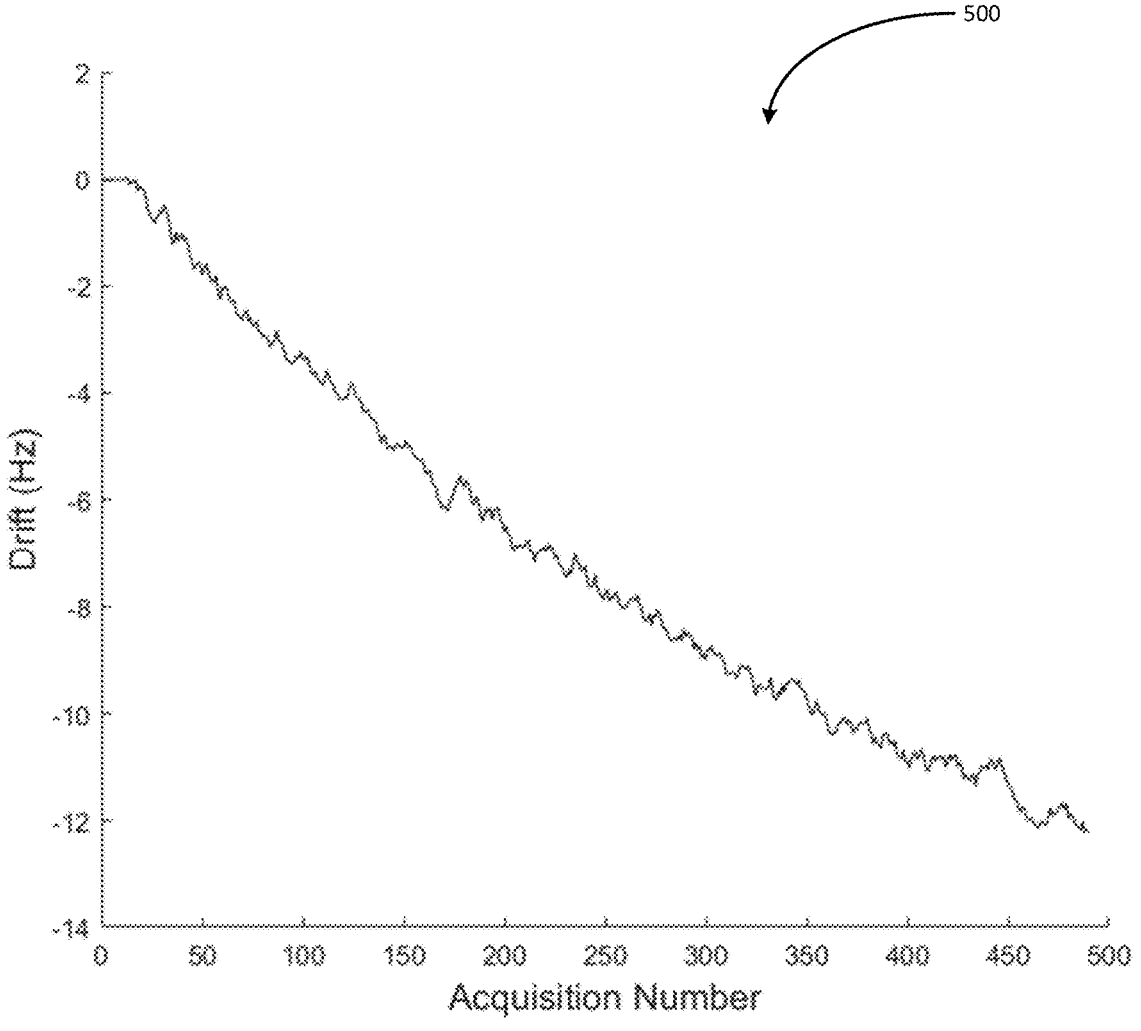
FIG. 5 is an example graph illustrating frequency drift (Hz) over a number of medical imaging acquisitions.

Returning to step S422, if the difference of the change in frequency minus the old frequency is not greater than (i.e., is less than or equal to) the threshold value, then at step S426 the processor 30 adjusts the frequency by the change in frequency. The processor 30 additionally sets the value of the old change in frequency, $\Delta F\_old$, to the change in frequency, $\Delta F$. Then, the method 400 returns to step S404 where the scan count variable is incremented for a next TR of the plurality of TRs. The process then continues as discussed herein In at least one example embodiment, the frequency adjustment described in the method 300 and the method 400 enables relatively small frequency adjustments. In particular, sub-hertz frequency adjustments are typical of the methods described herein. Sub-hertz frequency adjustments enable smaller frequency adjustments to be made throughout the course of a medical imaging examination. These relatively small frequency adjustments may improve spectral quality. In particular, spectroscopy involves a relatively small bandwidth which is sensitive to small changes in frequency. Thus, sub-hertz frequency adjustments result in improved imaging quality due to the sensitivity of spectroscopy. As shown in the graph 500 of FIG. 5, over 500 acquisitions of a medical imaging operation, the total frequency drift reached approximately −12 Hz. The graph 500 shows a frequency drift during an example MR imaging procedure where the frequency was continuously adjusted based on the example embodiments described herein.

Figure 6:
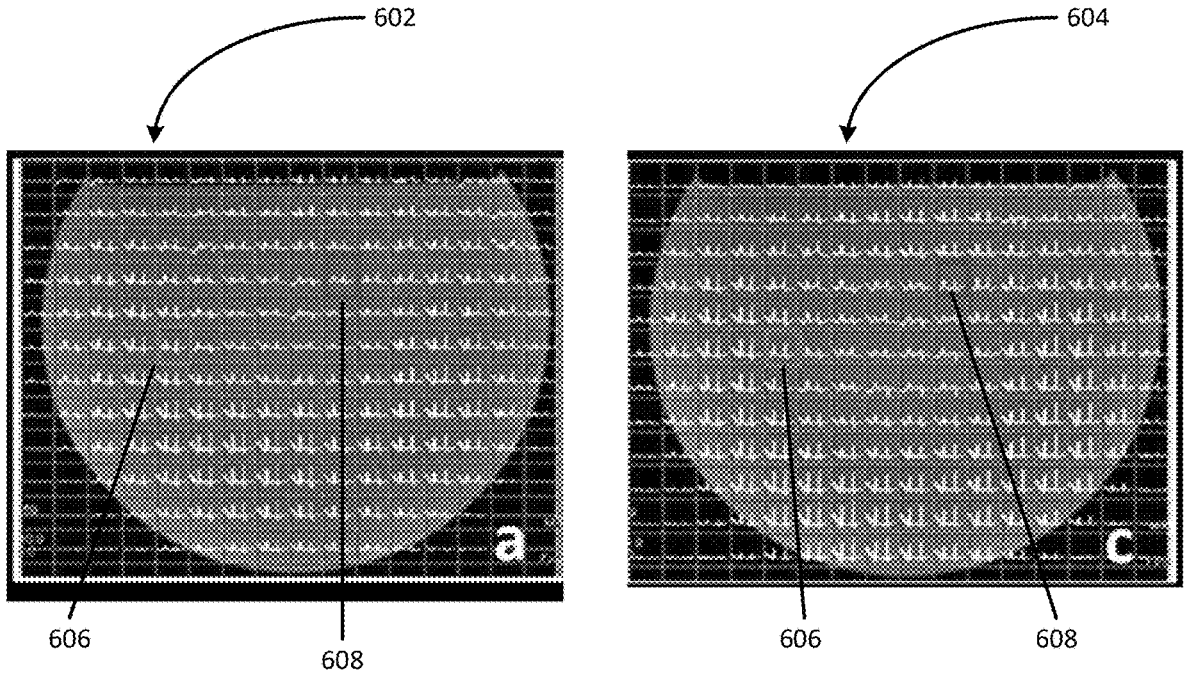
FIG. 6 is an illustration of spectral maps according to example embodiments.
Figure 7:
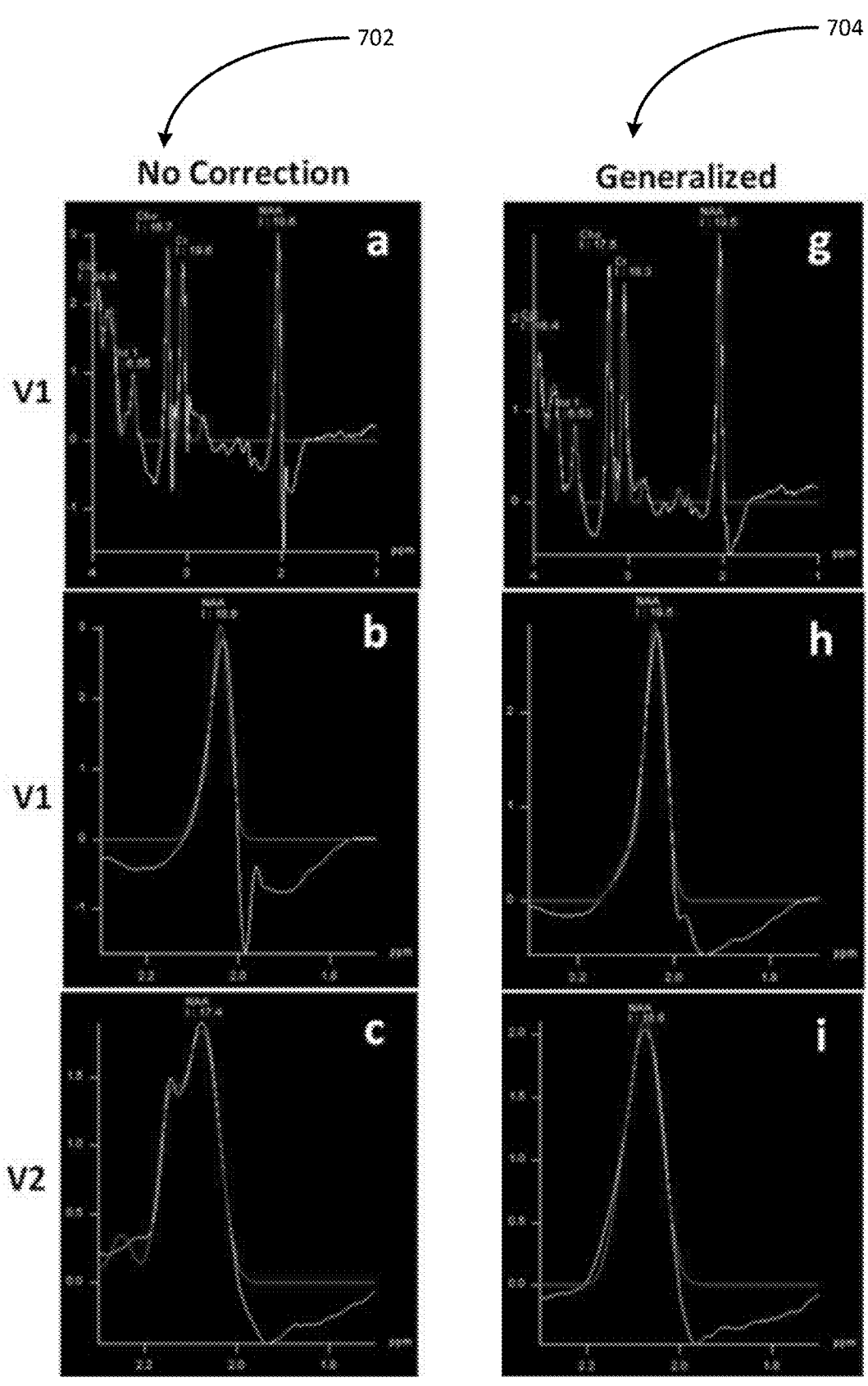
FIG. 7 is an illustration of spectral signals of voxels of the spectral maps of FIG. 6 according to example embodiments.

The embodiments described herein result in improved imaging processes. For example, the embodiments described herein result in improved signals over imaging without frequency correction. FIGS. 6 and 7 show experimental results of the embodiments described herein compared to imaging procedures without frequency correction. FIG. 6 shows a first spectral map 602 and a second spectral map 604. The first spectral map 602 was acquired with no frequency adjustments and the second spectral map 604 was acquired using the systems and methods of frequency adjustment described herein. The second spectral map 604 shows improved signals, specifically on the lateral and lower side of the second spectral map 604, than the first spectral map 602.

FIG. 7 shows spectral signals of a first voxel 606 and a second voxel 608 of the first spectral map 602 and the second spectral map 604 of FIG. 6. Column 702 shows spectral signals where no frequency adjustment was made and column 704 shows spectral signals where frequency adjustment was performed using the embodiments described herein. Spectral signals a, b, g, and h show the signal of the first voxel 606. Spectral signals b and h are zoomed in versions of the spectral signals a and g. The spectral signals g and h show a better baseline and a narrower spectrum than the uncorrected frequency spectral signals a and b. Spectral signals c and i show the signal of the second voxel 608. The spectral signal i shows a single peak shape whereas the spectral signal c shows a split peak. Thus, the embodiments described herein result in improved spectral signals over imaging procedures without frequency adjustments.

The systems, apparatuses, and methods described herein enable real time frequency adjustments to be made during medical imaging. The embodiments described herein are able to be performed without performing a calibration or reference frequency scan prior to beginning a medical imaging process which enables the medical imaging to be carried out in a more streamlined manner and reduces time needed to perform medical imaging.

Although the present invention has been described in detail with reference to example embodiments, the present invention is not limited by the disclosed examples from which the skilled person is able to derive other variations without departing from the scope of the invention.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

The terminology used herein is for the purpose of describing particular embodiments only and is not intended to be limiting of example embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific structural and functional details disclosed herein are merely representative for purposes of describing example embodiments. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, at least one central processing unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

For example, when a hardware device is a computer processing device (e.g., a processor, Central At least one processor (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special-purpose computer processing device. In a more specific example, when the program code is loaded into a processor, the processor becomes programmed to perform the program code and operations corresponding thereto, thereby transforming the processor into a special-purpose processor. According to one or more example embodiments, at least one memory may include or store computer program code, and the at least one memory and the computer program code may be configured to, with at least one processor, cause an information processing device and/or an acquisition device to perform the necessary tasks. Additionally, the processor, memory and example algorithms, encoded as computer program code, serve as means for providing or causing performance of operations discussed herein.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher-level program code that is executed using an interpreter.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer-readable recording mediums, including the tangible or non-transitory computer-readable storage media discussed herein.

Even further, any of the disclosed methods may be embodied in the form of a program or software. The program or software may be stored on a non-transitory computer-readable medium and is adapted to perform any one of the aforementioned methods when run on a computer device (a device including a processor). Thus, the non-transitory, tangible computer-readable medium, is adapted to store information and is adapted to interact with a data processing facility or computer device to execute the program of any of the above mentioned embodiments and/or to perform the method of any of the above-mentioned embodiments.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for performing a real-time frequency adjustment during medical imaging, the method comprising:
   applying a navigator before a repetition time (TR) variant spatial-encoding event of a first TR of a plurality of TRs;
   determining phase change information from a navigator signal, the navigator signal being acquired after the navigator is applied; and
   adjusting a radio frequency (RF) pulse frequency of the medical imaging based on the phase change information.

2. The method of claim 1, wherein each TR of the plurality of TRs includes at least one TR invariant event and a TR variant event.

3. The method of claim 2, wherein the at least one TR invariant event includes at least one TR invariant RF pulse.

4. The method of claim 3, wherein the at least one TR invariant event further includes at least one TR invariant gradient pulse.

5. The method of claim 1, wherein the TR variant spatial-encoding event includes at least one TR variant gradient pulse.

6. The method of claim 1, wherein the adjusting the RF pulse frequency of the medical imaging is a real time frequency adjustment that is localized to an imaging region of interest.

7. The method of claim 1, wherein the applying, the determining, and the adjusting are repeated during each TR of the plurality of TRs.

8. The method of claim 7, further comprising:
   compensating for signal to noise ratio during the medical imaging by using a moving average of the navigator signal calculated from each TR of the plurality of TRs of the medical imaging.

9. The method of claim 1, further comprising:
   acquiring a reference frequency from an initial number of TR of the plurality of TRs.

10. The method of claim 9, further comprising:
    determining a scan frequency based on the phase change information and a dwell time; and
    determining a change in frequency based on the reference frequency and the scan frequency.

11. The method of claim 10, wherein the RF pulse frequency is not adjusted when the change in frequency exceeds a threshold value.

12. A system for performing a real-time frequency adjustment during medical imaging, the system comprising:
    at least one memory configured to store instructions; and
    at least one processor configured to execute the instructions to cause the system to
    apply a navigator before a repetition time (TR) variant spatial-encoding event of a first TR of a plurality of TRs;

determine phase change information from a navigator signal, the navigator signal being acquired after the navigator is applied; and adjust a radio frequency (RF) pulse frequency of the medical imaging based on the phase change information.

13. The system of claim 12, wherein each TR of the plurality of TRs includes at least one TR invariant event and a TR variant event.

14. The system of claim 13, wherein the at least one TR invariant event includes at least one TR invariant RF pulse.

15. The system of claim 14, wherein the at least one TR invariant event further includes at least one TR invariant gradient pulse.

16. The system of claim 12, wherein the TR variant spatial-encoding event includes at least one TR variant gradient pulse.

17. The system of claim 12, wherein adjusting the RF pulse frequency of the medical imaging is a real time frequency adjustment that is localized to an imaging region of interest.

18. The system of claim 12, wherein the applying, the determining, and the adjusting are repeated during each TR of the plurality of TRs.

19. The system of claim 18, wherein the processor is further configured to cause the system to:

compensate for signal to noise ratio during the medical imaging by using a moving average of the navigator signal calculated from each TR of the plurality of TRs of the medical imaging.

20. The system of claim 12, wherein the processor is further configured to cause the system to:

acquire a reference frequency from an initial number of TR of the plurality of TRs.

21. The system of claim 20, wherein the processor is further configured to cause the system to:

determine a scan frequency based on the phase change information and a dwell time; and determine a change in frequency based on the reference frequency and the scan frequency.

22. The system of claim 21, wherein the RF pulse frequency is not adjusted when the change in frequency exceeds a threshold value.

23. A method for performing a real-time frequency adjustment during medical imaging, the method comprising:

applying a navigator after at least one repetition time (TR) invariant event of a first TR of a plurality of TRs;

determining phase change information from a navigator signal, the navigator signal being acquired after the navigator is applied; and adjusting a radio frequency (RF) pulse frequency of the medical imaging based on the phase change information.

24. The method of claim 23, wherein the at least one TR invariant event is a selective RF pulse.

25. The method of claim 23, wherein the navigator is applied before a TR variant event.

\* \* \* \* \*